United States Patent
Tang et al.

(10) Patent No.: US 7,072,205 B2
(45) Date of Patent: Jul. 4, 2006

(54) FLOATING-BODY DRAM WITH TWO-PHASE WRITE

(75) Inventors: Stephen H. Tang, Pleasanton, CA (US); Ali Keshavarzi, Portland, OR (US); Dinesh Somasekhar, Portland, OR (US); Fabrice Paillet, Hillsboro, OR (US); Muhammad M. Khellah, Oswego, OR (US); Yibin Ye, Portland, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 10/716,755

(22) Filed: Nov. 19, 2003

(65) Prior Publication Data

US 2005/0105342 A1    May 19, 2005

(51) Int. Cl.
   G11C 11/24    (2006.01)
   G11C 11/34    (2006.01)
(52) U.S. Cl. ............... 365/150; 365/149; 365/174; 365/182; 365/184; 365/186
(58) Field of Classification Search .............. 365/184, 365/149, 182, 189.01
   See application file for complete search history.

(56) References Cited

U.S. PATENT DOCUMENTS

| | | | |
|---|---|---|---|
| 6,538,916 B1 * | 3/2003 | Ohsawa ............... 365/149 |
| 6,714,436 B1 * | 3/2004 | Burnett et al. ........ 365/149 |
| 6,825,524 B1 * | 11/2004 | Ikehashi et al. ....... 257/314 |
| 6,873,539 B1 * | 3/2005 | Fazan et al. .......... 365/149 |
| 2004/0021137 A1 * | 2/2004 | Fazan et al. ........... 257/1 |

OTHER PUBLICATIONS

Fazan, Pierre, et al., "A Simple 1-Transistor Capacitor-Less Memory Cell for High Performance Embedded DRAMs", *IEEE 2002 Custom Integrated Circuits Conference*, (2002),99-102.

Ohsawa, Takashi, et al., "A Memory Using One-Transistor Gain Cell on SOI(FBC) with Performance Suitable for Embedded DRAMs", *2003 Symposium on VLSI Circuits Digest of Technical Papers*, (2003),4 pages.

Ohsawa, Takashi, et al., "Memory Design Using a One-Transistor Gain Cell on SOI", *IEEE Journal of Solid-State Circuits, vol. 37, No. 11*, (Nov. 2002),1510-1522.

Ohsawa, Takashi, et al., "Memory Design Using One-Transistor Gain Cell on SOI", *ISSCC 2002, Session 9, Dram and Ferroelectric Memories, 9.1*, (Feb. 5, 2002),3 pages.

Okhonin, S., "A Capacitor-Less 1T-DRAM Cell", *IEEE Electron Device Letters, vol. 23, No. 2*, (Feb. 2002),85-87.

Okhonin, S., et al., "A SOI Capacitor-less 1T-DRAM Concept", *2001 IEEE International SOI Conference*, (Oct. 2001),153-154.

* cited by examiner

*Primary Examiner*—Son Mai
(74) *Attorney, Agent, or Firm*—LeMoine Patent Services, PLLC (57) ABSTRACT

A row of floating-body single transistor memory cells is written to in two phases.

23 Claims, 6 Drawing Sheets

FLOATING-BODY DRAM WITH TWO-PHASE WRITE

FIELD

The present invention relates generally to memory circuits, and more specifically to memory circuits with floating-body transistors.

BACKGROUND

Floating-body dynamic random access memory (DRAM) cells typically utilize a single transistor without a separate capacitor for charge storage. The amount of charge on the floating body of the single transistor in the cell determines the cell state. The amount of charge on the floating body modulates the on-state current of the transistor, which may be used to sense and read the cell state. To write the cell, the body is either charged or discharged.

Voltages applied across transistor terminals in floating-body DRAM cells may be large. The maximum voltages at which transistors can safely operate typically decrease with device dimensions. Each generation of smaller transistors manufactured with new processes typically have tighter process-imposed voltage limitations. Exceeding process-imposed voltage limitations may impact device reliability.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
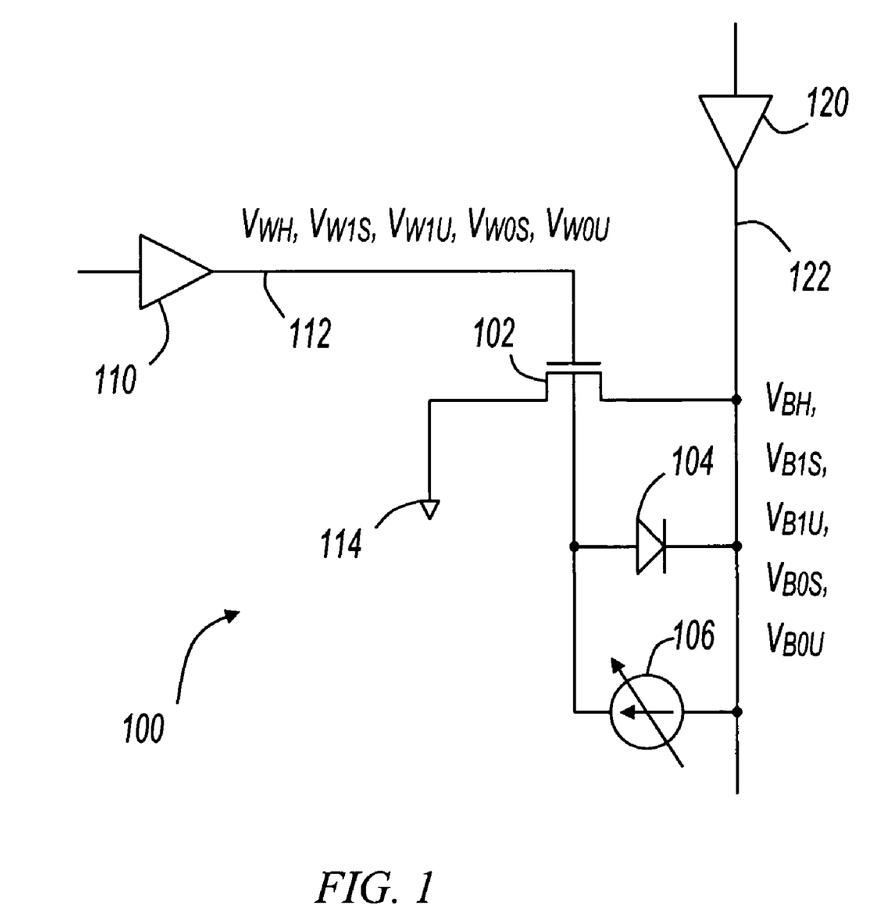
FIG. 1 shows a diagram of a floating-body DRAM cell, a word line driver, and a bit line driver.

FIG. 1 shows a diagram of a floating-body DRAM cell, a word line driver, and a bit line driver. The floating-body DRAM cell includes a single transistor 102. Also shown in FIG. 1 are word line driver 110 and bit line driver 120. As shown in FIG. 1, transistor 102 is an n-type metal oxide semiconductor field effect transistor (NMOSFET) having a body that is electrically floating. Transistor 102 includes a gate coupled to word line 112, a source coupled to node 114, and a drain coupled to bit line 122.

Although an NMOSFET is shown in FIG. 1, this is not a limitation of the present invention. For example, transistor 102 may a p-type field effect transistor or any other type of transistor suitable to hold a charge on a floating body. Further, in some embodiments, transistor 102 is implemented using silicon-on-insulator (SOI) technology, and in other embodiments, transistor 102 is implemented using bulk silicon technology. In some embodiments, a floating body is created using floating n-wells or shallow-well technology.

The floating-body DRAM cell is programmed by either charging or discharging the floating body of transistor 102. Controllable current source 106 is used to charge the floating body, and diode 104 is used to discharge the floating body. For example, when controllable current source 106 is on, the floating body is charged, and when diode 104 is forward-biased, the floating body is discharged.

In some embodiments, the floating-body DRAM cell is holding a "0" when the body is discharged, and the floating-body DRAM cell is holding a "1" when the body is charged, but this is not a limitation of the present invention. For example, in some embodiments, a "0" is represented by a charged body, and a "1" is represented by a discharged body.

The state of the floating-body DRAM cell may be sensed by detecting a drain-to-source current of transistor 102 when transistor 102 is on. The "on" current of transistor 102 is modulated by the amount of charge on the body of the transistor, and the current may be sensed using any suitable sense amplifier circuit (not shown).

In some embodiments, diode 104 and controllable current source 106 do not exist separately from transistor 102. For example, diode 104 may be formed by the PN junction between the body and the n-diffusion drain of transistor 102. Also for example, controllable current source 106 may represent an impact ionization current that flows when certain voltage relationships exist between the terminals of transistor 102. Accordingly, diode 104 and controllable current source 106 are shown in FIG. 1 to explain the operation of the floating-body DRAM cell, and not necessarily to indicate device structures separate from transistor 102.

FIG. 1 shows one floating-body DRAM cell. In some embodiments, many floating-body DRAM cells exist in a single memory device. For example, a "row" of floating-body DRAM cells may exist, with each floating-body DRAM cell having a transistor gate coupled to an output of a word line driver such as word line driver 110. Also in some embodiments, a "column" of floating-body DRAM cells may exist, with each floating-body DRAM cell having a transistor drain coupled to an output of a bit line driver such as bit line driver 120. Further, in some embodiments, an array of floating-body DRAM cells may exist, where the array is arranged in rows and columns as described above.

In operation, data is written to a row within an array of floating-body DRAM cells in two phases. In some embodiments, a row of floating-body DRAM cells is selected, and a "word" of data is written to the row of cells by first writing one logical value to some or all of the cells in the selected row, and then writing a complementary logical value to some or all of the cells in the selected row. For example, data may be written by first writing a "0" to some or all of the cells in the selected row during a first phase, and then writing a "1" to some or all of the cells in the selected row during a second phase. For this example, a "0" is written to a cell by discharging a transistor body, and a "1" is written to a cell by charging a transistor body.

Word line driver 110 may be a driver adapted to generate many different voltages. For example, as shown in FIG. 1, in some embodiments, word line driver 110 may generate five different voltage values. The five word line voltage values are described in Table 1, below.

TABLE 1

| | |
|---|---|
| $V_{WH}$ | Word line Hold Voltage - the voltage on a word line when no writes are taking place. |
| $V_{W1S}$ | Word line "1" Selected Voltage - the voltage applied to a selected word line when writing a "1." |
| $V_{W1U}$ | Word line "1" Unselected Voltage - the voltage applied to an unselected word line when writing a "1." |
| $V_{W0S}$ | Word line "0" Selected Voltage - the voltage applied to a selected word line when writing a "0." |
| $V_{W0U}$ | Word line "0" Unselected Voltage - the voltage applied to an unselected word line when writing a "0." |

In some embodiments, word line driver 110 may generate a different voltage value for each entry shown in Table 1. In other embodiments, word line driver 110 may generate fewer than five different voltage values by combining entries in Table 1, and utilizing one voltage value for multiple entries in Table 1. For example, in some embodiments, $V_{WH}$ and $V_{W0U}$ may be the same voltage, and word line driver 110 may be adapted to generate four different voltages.

Bit line driver 120 may be a driver adapted to generate many different voltages. For example, as shown in FIG. 1, in some embodiments, bit line driver 120 may generate five different voltage values. The five bit line voltage values are described in Table 2, below.

TABLE 2

| | |
|---|---|
| $V_{BH}$ | Bit line Hold Voltage - the voltage on a bit line when no writes are taking place. |
| $V_{B1S}$ | Bit line "1" Selected Voltage - the voltage applied to a selected bit line when writing a "1." |
| $V_{B1U}$ | Bit line "1" Unselected Voltage - the voltage applied to an unselected bit line when writing a "1." |
| $V_{B0S}$ | Bit line "0" Selected Voltage - the voltage applied to a selected bit line when writing a "0." |
| $V_{B0U}$ | Bit line "0" Unselected Voltage - the voltage applied to an unselected bit line when writing a "0." |

In some embodiments, bit line driver 120 may generate a different voltage value for each entry shown in Table 2. In other embodiments, bit line driver 120 may generate fewer than five different voltage values by combining entries in Table 2, and utilizing one voltage value for multiple entries in Table 2. For example, in some embodiments, $V_{BH}$ and $V_{B0U}$ may be the same voltage, and bit line driver 120 may be adapted to generate four different voltages.

The actual voltages used for the voltage values shown in Tables 1 and 2 may be chosen to reduce various voltages impressed across terminals of transistor 102. For example, during the discharging of the floating body of transistor 102, $V_{W0S}$ and $V_{B0S}$ may be chosen to turn on diode 104 without exceeding a process-imposed maximum gate-to-drain voltage. Further, during charging of the floating body of transistor 102, $V_{W1S}$ and $V_{B1S}$ may be chosen to turn on current source 106 without exceeding any process-imposed maximum voltage limits.

Figure 2:
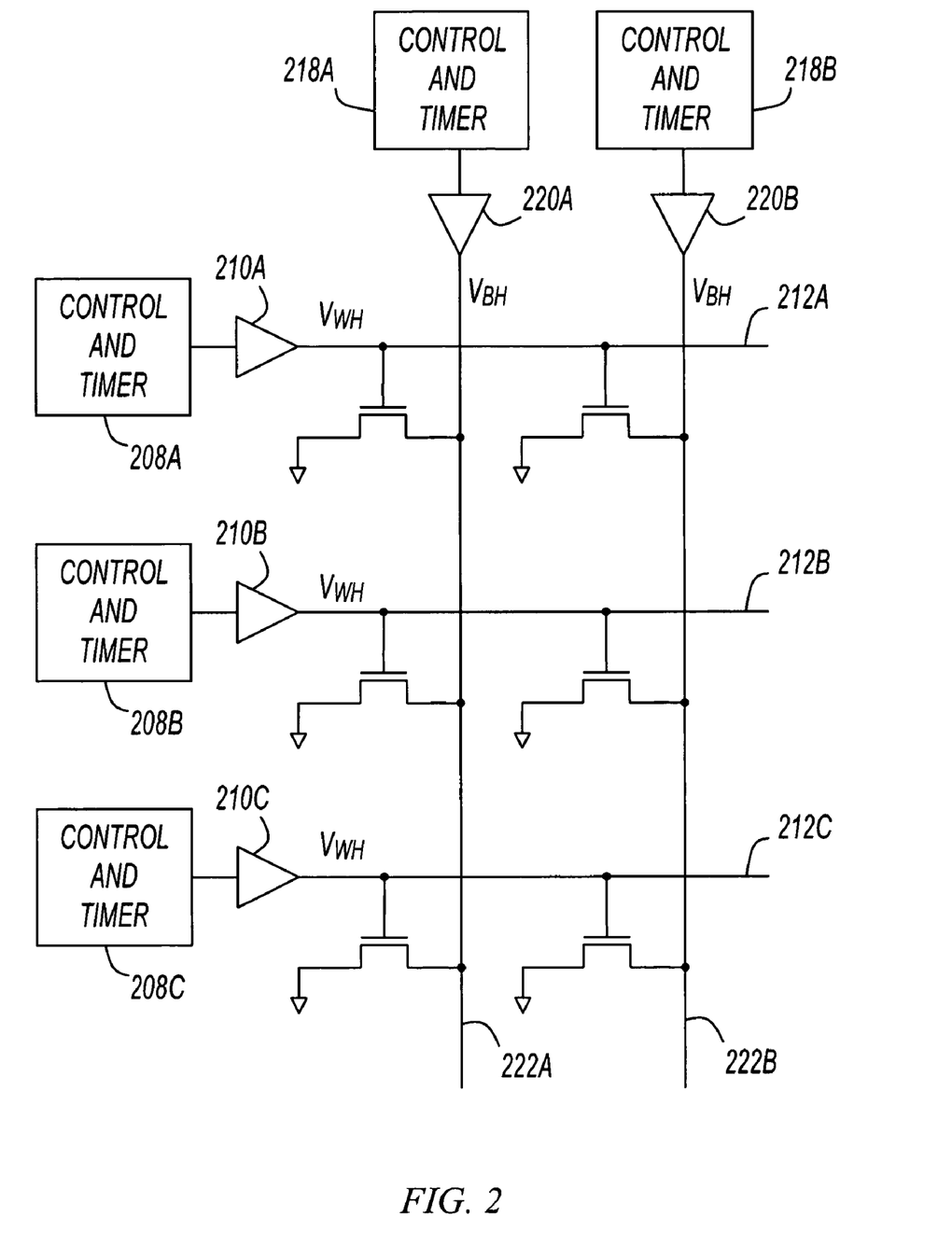
FIG. 2 shows an array of floating-body DRAM cells.

FIG. 2 shows an array of floating-body DRAM cells. FIG. 2 also includes control and timer circuits 208A, 208B, 208C, 218A, and 218B; word line drivers 210A, 210B, and 210C; and bit line drivers 220A and 220B. As shown in FIG. 2, bit line drivers 220A and 220B may drive a voltage $V_{BH}$ on bit lines 222A and 222B, and word line drivers 210A, 210B, and 210C may drive a voltage $V_{WH}$ on word lines 212A, 212B, and 212C. In some embodiments, $V_{BH}$ is equal to the voltage on the sources of the transistors, and $V_{WH}$ is a voltage that is negative with respect to $V_{BH}$. This places each of the transistors shown in FIG. 2 in accumulation, and no writes are taking place.

As shown in FIG. 2, the transistor bodies in the array of floating-body DRAM cells are being "held" in a substantially constant state of charge. The word line voltage $V_{WH}$, and the bit line voltage $V_{BH}$, may be any voltage values that work to keep a substantially constant charge on the transistor bodies. For example, referring now back to FIG. 1, $V_{WH}$ and $V_{BH}$ may be chosen such that diode 104 and current source 106 are off for each transistor in the array.

Control and timer circuits 208A, 208B, 208C, 218A, and 218B may be any suitable circuits to influence the operation of the word line drivers and bit line drivers. For example, control and timer circuits 208A, 208B, 208C, 218A, and 218B may be circuits that control which voltage is driven on the word lines and bit lines, when the voltages are driven, and for how long. In some embodiments, the control and timer circuits are distributed state machines, and in other embodiments, the control and timer circuits are implemented in one or more centralized state machines. In other embodiments, control and timer circuits are combined with drivers. For example, in some embodiments, control and timer 208A is combined with word line driver 210A.

Figure 3:
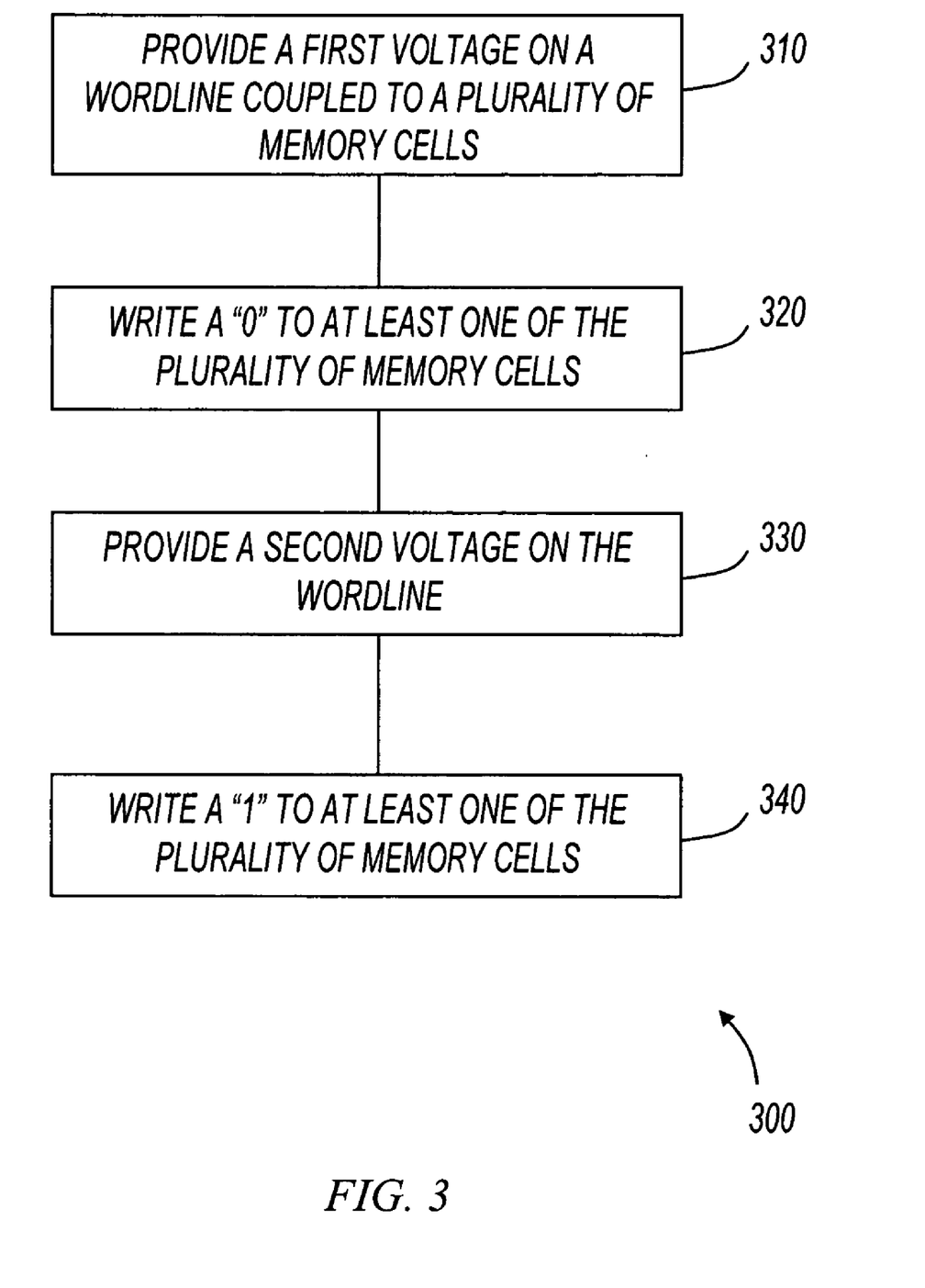
FIG. 3 shows a flowchart in accordance with various embodiments of the present invention.

FIG. 3 shows a flowchart in accordance with various embodiments of the present invention. In some embodiments, method 300 may be used to write to a row of floating-body DRAM cells in two phases. A first phase may write a first logical value, and a second phase may write a complementary logical value. For example, a first phase may write "0s" to one or more cells in a selected row, and a second phase may write "1s" to one or more cells in the selected row. In some embodiments, method 300, or portions thereof, is performed by a processor or electronic system, embodiments of which are shown in the various figures. In other embodiments, method 300 is performed by a control circuit within a memory device. Method 300 is not limited by the particular type of apparatus, software element, or person performing the method. The various actions in method 300 may be performed in the order presented, or may be performed in a different order. Further, in some embodiments, some actions listed in FIG. 3 are omitted from method 300.

Figure 4:
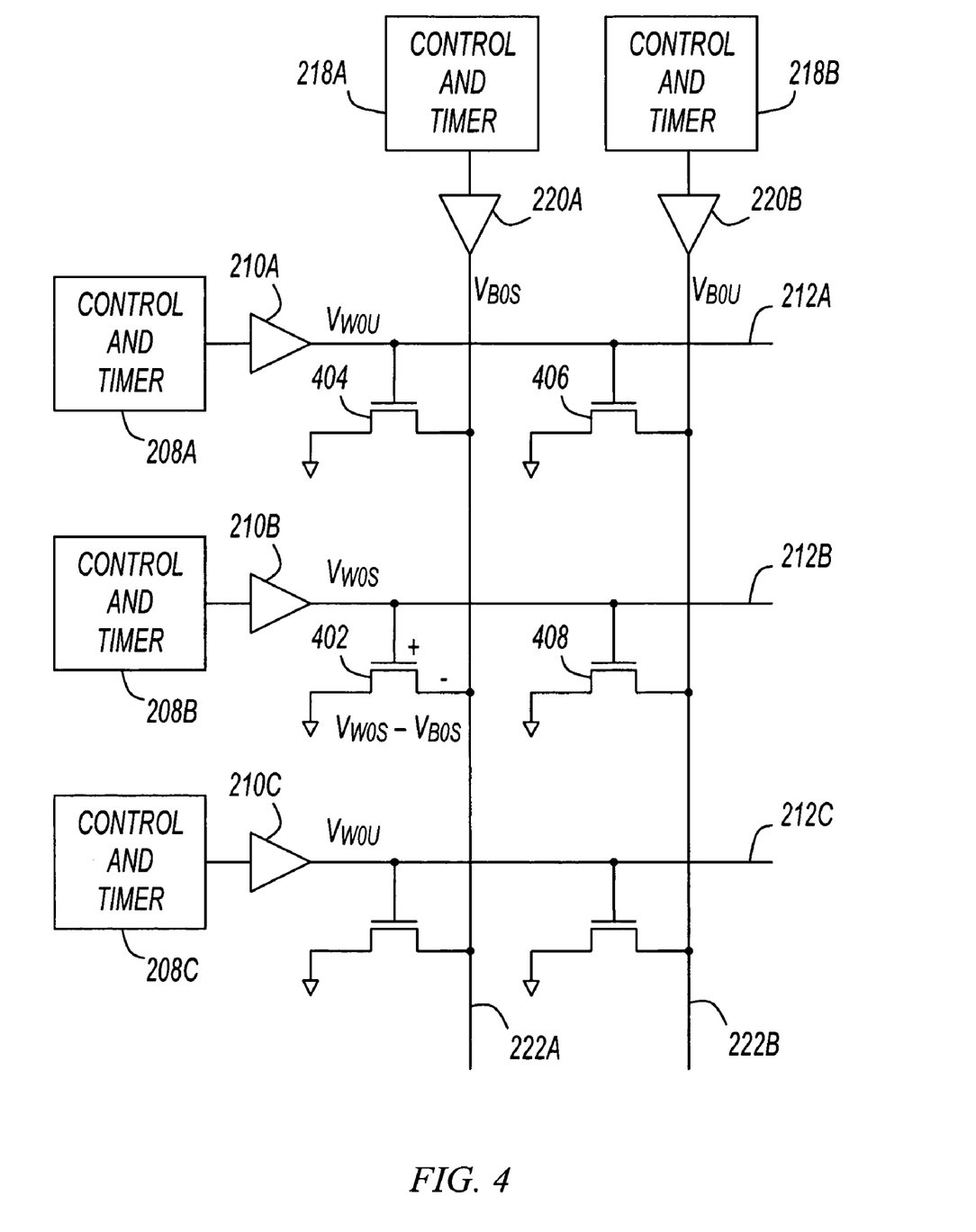
FIGS. 4 and 5 show an array of floating-body DRAM cells with various voltages applied.
Figure 5:
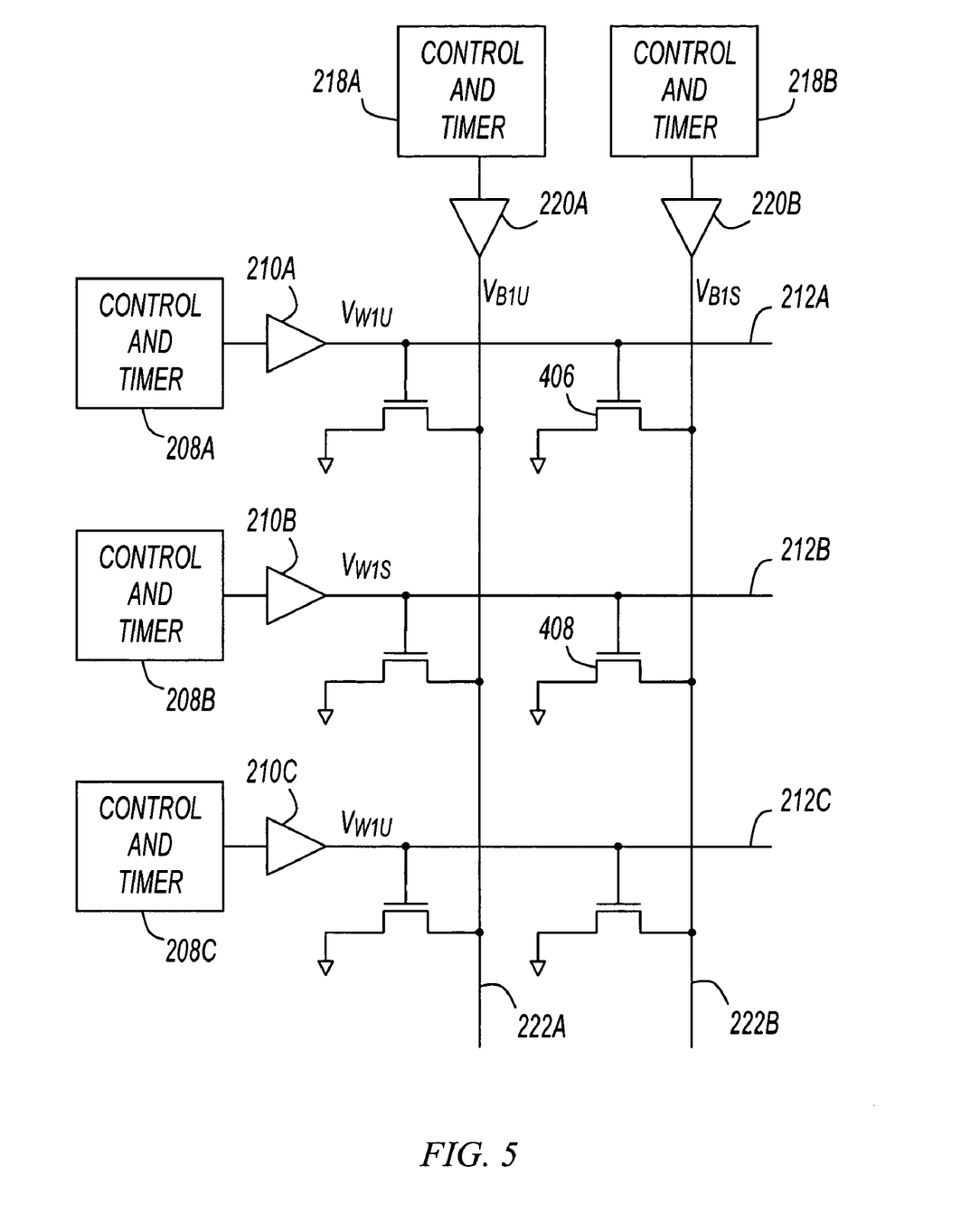

Method 300 (FIG. 3) is described with reference to FIGS. 4 and 5, which show an array of floating-body DRAM cells with various voltages applied. FIG. 4 shows the array with a "0" being written to a single floating-body DRAM cell within the array, and FIG. 5 shows the same array with a "1" being written to a different single floating-body DRAM cell within the array.

Method 300 is shown beginning at block 310 in which a first voltage is provided on a word line coupled to a plurality of memory cells. The first voltage provided on the word line corresponds to $V_{W0S}$. By applying $V_{W0S}$ to the word line, the row coupled to the word line is "selected." In some embodiments, word lines other than the selected word line have a different voltage applied. For example, $V_{W0U}$ may be applied to the other, unselected, word lines. Referring now to FIG. 4, the selected row is coupled to word line 212B, which is driven by word line driver 210B, and the unselected rows are coupled to word lines 212A and 212C, which are driven by word line drivers 210A and 210C.

At 320, a "0" is written to at least one of the plurality of memory cells. This corresponds to providing $V_{B0S}$ on the bit lines of the cells to be written with a "0." By applying $V_{B0S}$ to one or more bit lines, the column(s) coupled to the bit lines are selected, and a "0" is written to any cells coupled to both the selected row and the selected columns. In some embodiments, bit lines other than the selected bit lines have a different voltage applied. For example, $V_{B0U}$ may be applied to other, unselected, bit lines. Referring now to FIG. 4, the selected column is coupled to bit line 222A, which is driven by bit line driver 220A, and the unselected column is coupled to bit line 222B, which is driven by bit line driver 220B.

FIG. 4 shows a memory array with three rows and two columns. In some embodiments, the memory array includes more columns such that each row includes more than two cells, and the memory array includes more rows such that each column includes more than three cells. FIG. 4 also shows a single selected bit line and a single unselected bit line. In some embodiments, more than one bit line is selected in a single write operation. For example, in an array with 32 columns, any number of bit lines between zero and 32 may be selected. In general, a subset of the total number of bit lines is selected at 320, where the subset is any size.

In the example write operation represented in FIG. 4, the body of transistor 402 is discharged. The gate of transistor 402 is coupled to a selected word line having a voltage of $V_{W0S}$, and the drain of transistor 402 is coupled to a selected bit line having a voltage of $V_{B0S}$. In operation, $V_{W0S}$ is a voltage that raises the transistor body voltage through capacitive coupling between the gate and body of the transistor, and $V_{B0S}$ is a voltage that reduces the transistor drain voltage to turn on a body-to-drain diode such as diode 104 (FIG. 1). The gate-to-drain voltage on the selected transistor (transistor 402) is equal to $V_{W0S}-V_{B0S}$. In some embodiments this gate-to-drain voltage is great enough to turn on a body-to-drain diode, and less than $V_{MAX}$, where $V_{MAX}$ is a process-imposed maximum gate-to-drain voltage.

The remaining transistors shown in FIG. 4 also have gate-to-drain voltages that are less than $V_{MAX}$. For example, transistor 404 is coupled to an unselected row and a selected column, and has a gate-to-drain voltage of $V_{W0U}-V_{B0S}$, which is less than $V_{MAX}$. Also for example, transistor 406 is coupled to an unselected row and an unselected column, and has a gate-to-drain voltage of $V_{W0U}-V_{B0U}$. Also for example, transistor 408 is coupled to a selected row and an unselected column, and has a gate-to-drain voltage of $V_{W0S}-V_{B0U}$, which is less than $V_{MAX}$.

In some embodiments, $V_{W0U}$ and $V_{B0U}$ are chosen to be the same voltages as $V_{WH}$ and $V_{BH}$, respectively. In these embodiments, transistors coupled to unselected rows and unselected columns are held in accumulation in the same manner as shown in FIG. 2. Further, in these embodiments, $V_{W0S}$ may be a voltage that is positive with respect to $V_{WH}$, and $V_{B0S}$ may be a voltage that is negative with respect to $V_{BH}$.

The foregoing description of blocks 310 and 320 (FIG. 3) and FIG. 4 correspond to a first phase of a two-phase write cycle in a memory device. In this first phase, transistor 402 is written with a first logical value by discharging the body of the transistor. Transistor 402 is part of a single transistor memory cell within an array of memory cells, where the array includes rows and columns. As shown in FIG. 4, transistor 402 is a subset of the transistors in selected row. In some embodiments, the subset includes the entire row of memory cells, such that the first phase of the write discharges all of the transistor bodies in the selected row.

At 330, a second voltage is provided on the word line that was selected at 310. The second voltage provided on the word line corresponds to $V_{W1S}$. By applying $V_{W1S}$ to the word line, the row coupled to the word line is selected. In some embodiments, word lines other than the selected word line have a different voltage applied. For example, $V_{W1U}$ may be applied to the other, unselected, word lines. Referring now to FIG. 5, the selected row is coupled to word line 212B, which is driven by word line driver 210B, and the unselected rows are coupled to word lines 212A and 212C, which are driven by word line drivers 210A and 210C.

At 340, a "1" is written to at least one of the plurality of memory cells. This corresponds to providing $V_{B1S}$ on the bit lines of the cells to be written with a "1." By applying $V_{B1S}$ to one or more bit lines, the column(s) coupled to the bit lines are selected, and a "1" is written to any cells coupled to both the selected row and the selected columns. In some embodiments, bit lines other than the selected bit lines have a different voltage applied. For example, $V_{B1U}$ may be applied to other, unselected, bit lines. Referring now to FIG. 5, the selected column is coupled to bit line 222B, which is driven by bit line driver 220B, and the unselected column is coupled to bit line 222A, which is driven by bit line driver 220A.

FIG. 5 shows a memory array with three rows and two columns. In some embodiments, the memory array includes more columns such that each row includes; more than two cells, and the memory array includes more rows such that each column includes more than three cells. FIG. 5 also shows a single selected bit line and a single unselected bit line. In some embodiments, more than one bit line is selected in a single write operation. For example, in an array with 32 columns, any number of bit lines between zero and 32 may be selected. In general, a subset of the total number of bit lines is selected at 320, where the subset is any size.

In the example write operation represented in FIG. 5, the body of transistor 408 is charged while not disturbing the state of other cells in the array. The gate of transistor 408 is coupled to a selected word line having a voltage of $V_{W1S}$, and the drain of transistor 408 is coupled to a selected bit line having a voltage of $V_{B1S}$. In operation, $V_{W1S}$ and $V_{B1S}$ are voltages high enough to create an impact ionization current that charges the body of transistor 408. In some embodiments, $V_{W1S}$ and $V_{B1S}$ are substantially equal, and the gate-to-drain voltage on the selected transistor (transistor 408) is zero. In some of these embodiments, the voltage difference between $V_{W1S}$ and the drain of transistor 408 may approach $V_{MAX}$ to create a relatively large impact ionization current to charge the body of transistor 408, where $V_{MAX}$ is a process-imposed maximum gate-to-source voltage.

In some embodiments, $V_{W1U}$ may be a higher voltage than $V_{WH}$ in order to prevent a drain-to-gate voltage on unselected transistors from exceeding $V_{MAX}$. For example, referring now to transistor 406 in FIG. 5, the drain of transistor 406 has $V_{B1S}$ applied, and the gate of transistor 406 has $V_{W1U}$ applied. In embodiments in which $V_{B1S}$ is relatively large to create a large impact ionization current, $V_{W1S}$ may be higher than $V_{WH}$ in order to prevent a voltage greater than $V_{MAX}$ from appearing across the drain and gate of transistor 406.

The foregoing description of blocks 330 and 340 (FIG. 3) and FIG. 5 correspond to a second phase of a two-phase write cycle in a memory device. In this second phase, transistor 408 is written with a logical value that is the complement of the logical value written in the first phase.

This complementary logical value is written by charging the body of the transistor while not upsetting the charged state of other transistors in the array. Transistor 408 is part of a single transistor memory cell within an array of memory cells, where the array includes rows and columns. As shown in FIG. 5, transistor 408 is a subset of the transistors in selected row. In some embodiments, the subset includes the entire row of memory cells, such that the second phase of the write charges all of the transistor bodies in the selected row.

By selecting the voltages in Tables 1 and 2 (above) appropriately, process specific voltage limitations can be met in a two-phase write cycle. Table 3 shows possible relationships between the various voltages used in a two-phase write cycle.

TABLE 3

| | | Operation | | |
|---|---|---|---|---|
| | | Hold | Write "0" | Write "1" |
| Transistor Terminal | Gate | $V_{WH}$ = Very Low | $V_{WOS}$ = Medium $V_{WOU}$ = Very Low | $V_{WIS}$ = High $V_{WIU}$ = Low |
| | Drain | $V_{BH}$ = Low | $V_{BOS}$ = Very Low $V_{BOU}$ = Low | $V_{BIS}$ = High $V_{BIU}$ = Low |
| | Source | Low | Low | Low |

As shown in Table 3, the transistor source terminals are at a "low" voltage. For the purposes of explaining this example, a "low" voltage is considered to be at a reference potential relative to the memory array, and the other voltage values can be referenced to the "low" voltage value. Other voltage values appearing in Table 3 include a "very low" voltage that is below the "low" voltage, and "medium," and "high" voltages that are above the "low" voltage."

In some embodiments, the "high" voltage may correspond to $V_{MAX}$ for a particular manufacturing process. The two-phase write cycle may allow the use of a "high" voltage without violating process-imposed voltage limitations. For example, during a write of "0" (discharging a transistor body), the selected word line is moved to a "medium" voltage, while unselected word lines stay at a "very low" voltage. In some embodiments, the difference between the "medium" voltage on the word line and the "very low" voltage on the bit line approaches $V_{MAX}$ to turn on the diode as hard as possible without violating voltage limitations. Also for example, during write of a "1" (charging a transistor body), the voltage on the unselected word lines is raised from "very low" to "low" so that the "high" voltage on the bit line that causes impact ionization current does not exceed any limits.

The voltage relationships in Table 3 are shown as an example of possible voltage relationships for a two-phase write cycle of a floating-body memory, and the invention is not limited to the relationships shown in Table 3. For example, as shown Table 3, the bit line voltage when writing a "0" is different for unselected and selected columns, but in some embodiments, these voltages are the same. Also for example, as shown in Table 3, the bit line voltage when writing a "1" is different for unselected and selected columns, but in some embodiments, these voltages are the same. In embodiments represented by Table 3, bit line drivers may be adapted to drive three different voltage values. In other embodiments, the bit line drivers may be adapted to drive four, five, or more different voltage values in support of a multi-phase write cycle. Also in embodiments represented by Table 3, word line drivers may be adapted to drive four different voltage values. In other embodiments, the word line drivers may be adapted to drive three, four, five, or more different voltage values in support of a multi-phase write cycle.

Figure 6:
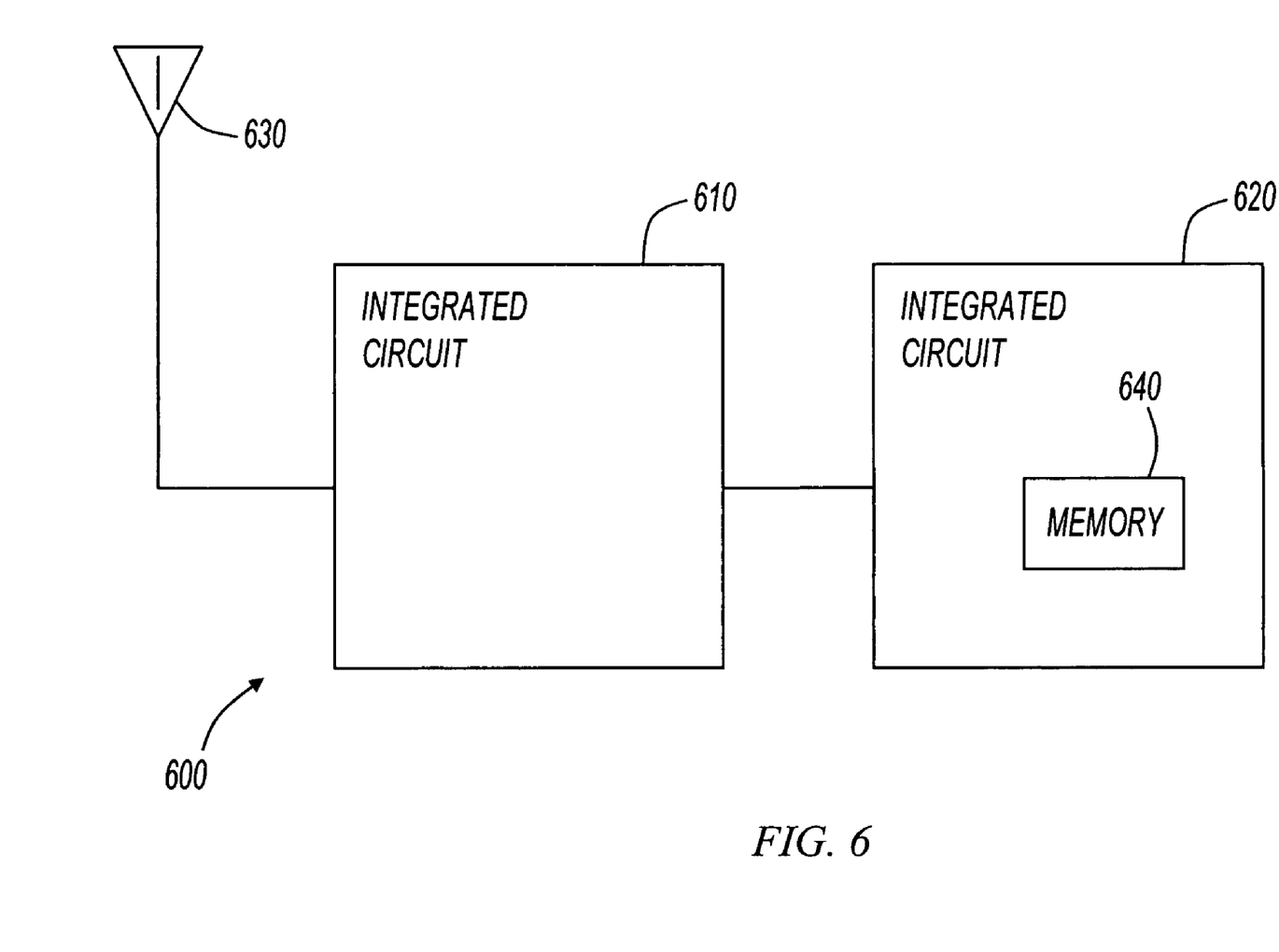
FIG. 6 shows a system diagram in accordance with various embodiments of the present invention.

FIG. 6 shows a system diagram in accordance with various embodiments of the present invention. FIG. 6 shows system 600 including integrated circuits 610 and 620, and antenna 630. In operation, system 600 receives a signal using antenna 630, and the signal is processed by the various elements shown in FIG. 6. Antenna 630 may be a directional antenna or an omni-directional antenna. As used herein, the term omni-directional antenna refers to any antenna having a substantially uniform pattern in at least one plane. For example, in some embodiments, antenna 630 may be an omni-directional antenna such as a dipole antenna, or a quarter wave antenna. Also for example, in some embodiments, antenna 630 may be a directional antenna such as a parabolic dish antenna or a Yagi antenna.

Integrated circuit 610 may include a radio frequency (RF) receiver, transmitter, or transceiver coupled to antenna 630. For example, in some embodiments, an RF receiver receives a signal from antenna 630 and performs "front end" processing such as low noise amplification (LNA), filtering, frequency conversion or the like.

Integrated circuit 620 includes memory 640. In some embodiments, memory 640 may be a floating-body DRAM memory that utilizes a two-phase write cycle. For example, memory 640 may utilize floating-body memory cells such as those shown in, and described with reference to, FIGS. 2, 4, and 5. Also for example, memory 640 may utilize a two-phase write cycle such as those described with reference to the previous figures.

In some embodiments, integrated circuit 620 may be a processor such as a microprocessor, a digital signal processor, a microcontroller, or the like. In some of these embodiments, memory 640 may be a cache memory on the same integrated circuit die. In other embodiments, memory 640 may be a cache memory co-located with a processor such as in a large package or multi-chip module. Memory 640 is shown used with an antenna in system 600. Many other uses for memory 640 exist. For example, memory 640 may be used in systems without an antenna.

Either integrated circuit 610 or 620 may be a processor or an integrated circuit other than a processor such as a radio frequency (RF) receiver, transmitter, or transceiver, an application-specific integrated circuit (ASIC), a communications device, a memory controller, or a memory such as a dynamic random access memory (DRAM). For ease of illustration, portions of integrated circuits 610 and 620 are not shown. The integrated circuits may include much more circuitry than illustrated in FIG. 6 without departing from the scope of the present invention.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Floating-body memory devices, word line drivers, bit line drivers, control and timer circuits, and other embodiments of the present invention can be implemented in many ways. In some embodiments, they are implemented in integrated circuits as part of memory devices. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method comprising writing data to floating-body memory cells in two phases, wherein each of the two phases utilizes a different word line voltage on a selected word line, and at least one of the two phases utilizes a different word line voltage on an unselected word line.

2. The method of claim 1 wherein a first phase writes to a first subset of memory cells coupled to the selected word line.

3. The method of claim 2 wherein the first phase discharges floating bodies of the first subset of memory cells.

4. The method of claim 2 wherein the first phase comprises reducing a voltage on at least one bit line to turn on a diode formed at least partially by a floating body of a transistor.

5. The method of claim 2 wherein a second phase writes to a second subset of memory cells coupled to the selected word line.

6. The method of claim 5 wherein the second phase charges floating bodies of the second subset of memory cells.

7. The method of claim 5 wherein:
the first phase includes providing a first drain voltage on the first subset of memory cells and a second drain voltage on cells other than the first subset; and
the second phase includes providing a third drain voltage on the second subset of memory cells and a fourth drain voltage on cells other than the second subset.

8. A method comprising:
providing a first voltage on a selected word line coupled to a plurality of memory cells;
writing "0" to at least one of the plurality of memory cells;
providing a second voltage on the selected word line;
increasing a voltage on unselected word lines; and
writing "1" to at least one of the plurality of memory cells.

9. The method of claim 8 wherein each of the plurality of memory cells includes a single transistor.

10. The method of claim 9 wherein the selected word line is coupled to gates of the single transistors.

11. The method of claim 9 wherein the second voltage is higher than the first voltage.

12. The method of claim 8 wherein each of the plurality of memory cells comprises a floating-body transistor.

13. The method of claim 8 wherein writing a "0" comprises providing a voltage on a selected bit line to turn on a diode.

14. The method of claim 8 wherein writing a "1" comprises providing a voltage on a selected bit line to generate an impact ionization current.

15. An apparatus comprising:
a plurality of rows of memory cells; and
a plurality of word line drivers, wherein each of the plurality of word line drivers is coupled to one of the plurality of rows of memory cells, the word line drivers to generate a first voltage when holding the state of the memory cells, a second voltage on a selected word line when writing a "0," a third voltage on the selected word line when writing a "1," and a fourth voltage on unselected word lines when writing a "1," wherein the fourth voltage is greater than the first voltage.

16. The apparatus of claim 15 wherein the plurality of word line drivers are adapted to generate at least four different voltages.

17. The apparatus of claim 16 wherein the plurality of word line drivers are adapted to generate at least five different voltages.

18. The apparatus of claim 15 wherein the plurality of rows of memory cells comprise floating-body transistors.

19. A memory device comprising:
floating-body single transistor memory cells; and
a plurality of word line drivers coupled to the floating-body single transistor memory cells to increase a voltage on unselected word lines during a memory write cycle in which selected ones of the floating-body single transistor memory cells have their bodies charged.

20. An electronic system comprising:
an antenna;
a first integrated circuit coupled to the antenna; and
a second integrated circuit including a memory device, the memory device comprising floating-body single transistor memory cells; and a plurality of word line drivers coupled to the floating-body single transistor memory cells to increase a voltage on unselected word lines during a memory write cycle in which selected ones of the floating-body single transistor memory cells have their bodies charged.

21. A method comprising increasing a voltage on unselected word lines during a memory device write cycle in which selected floating body transistors have their bodies charged.

22. The method of claim 21 wherein increasing a voltage on unselected word lines comprises increasing gate voltages on unselected transistors in selected columns to reduce a gate-to-drain voltage on the unselected transistors.

23. the method of claim 21 wherein an increased voltage on unselected word lines is chosen to keep a gate-to-drain voltage on unselected transistors within process imposed limits when a drain voltage is increased to charge a body of a selected transistor.

* * * * *